United States Patent
Chen et al.

(10) Patent No.: US 6,947,285 B2
(45) Date of Patent: Sep. 20, 2005

(54) THERMAL INTERFACE MATERIAL

(75) Inventors: Ga-Lane Chen, Fremont, CA (US); Charles Leu, Fremont, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/648,594

(22) Filed: Aug. 25, 2003

(65) Prior Publication Data

US 2004/0125565 A1 Jul. 1, 2004

(30) Foreign Application Priority Data

Dec. 31, 2002 (TW) ........................ 91137956 A

(51) Int. Cl.⁷ ............... H05K 7/20; H01L 23/40; H01L 23/373
(52) U.S. Cl. ............ 361/708; 361/704; 361/705; 361/718; 361/719; 257/706; 257/707; 257/717
(58) Field of Search .................. 361/687, 690, 361/697, 702–719, 696; 174/16.3; 165/80.3, 185; 257/705–707, 713, 717–719; 977/DIG. 1; 438/122

(56) References Cited

U.S. PATENT DOCUMENTS

| | | | |
|---|---|---|---|
| 5,077,637 A | * 12/1991 | Martorana et al. ......... 361/717 |
| 5,316,080 A | * 5/1994 | Banks et al. ............... 165/185 |
| 5,344,676 A | * 9/1994 | Kim et al. .................. 427/468 |
| 5,390,734 A | * 2/1995 | Voorhes et al. ............ 165/185 |
| 5,566,752 A | * 10/1996 | Arnold et al. .............. 165/185 |
| 5,641,466 A | * 6/1997 | Ebbesen et al. .......... 423/447.2 |
| 5,698,175 A | * 12/1997 | Hiura et al. ............. 423/447.1 |
| 5,742,471 A | * 4/1998 | Barbee et al. ............. 361/312 |
| 5,753,088 A | * 5/1998 | Olk ........................... 204/173 |
| 5,780,101 A | * 7/1998 | Nolan et al. ............... 427/216 |
| 5,898,569 A | * 4/1999 | Bhatia ....................... 361/700 |
| 5,965,267 A | * 10/1999 | Nolan et al. ............... 428/408 |
| 6,052,280 A | * 4/2000 | Dilley et al. ............... 361/687 |
| 6,060,166 A | * 5/2000 | Hoover et al. ............. 428/408 |
| 6,131,651 A | * 10/2000 | Richey, III ................ 165/185 |
| 6,278,231 B1 | * 8/2001 | Iwasaki et al. ............ 313/310 |
| 6,407,922 B1 | 6/2002 | Eckblad et al. |
| 6,473,351 B2 | * 10/2002 | Tomanek et al. .......... 365/215 |
| 6,542,370 B1 | * 4/2003 | Wang et al. ............... 361/704 |
| 2003/0111333 A1 | * 6/2003 | Montgomery et al. ...... 204/164 |
| 2004/0005736 A1 | * 1/2004 | Searls et al. ............... 438/122 |
| 2004/0097635 A1 | * 5/2004 | Fan et al. .................. 524/496 |

\* cited by examiner

*Primary Examiner*—Anatoly Vortman
(74) *Attorney, Agent, or Firm*—Wei Te Chung

(57) ABSTRACT

A thermal interface material (40) includes a polymer matrix and a number of carbon nanocapsules incorporated in the polymer matrix. The thermal interface material is sandwiched between a heat source (30) having a high density and a heat sink (50). The thermal interface material can provide a maximum surface contact area and can increase thermal conductivity between the heat source and the heat sink.

10 Claims, 1 Drawing Sheet

THERMAL INTERFACE MATERIAL

BACKGROUND OF THE INVENTION

1. Field of the Invention

The present invention relates to a thermal interface material, and especially to a thermal interface material having carbon nano-capsules contained therein. The thermal interface material can be used for transferring heat away from a heat source to a heat sink or other heat dissipation device.

2. Description of Related Art

Recent advances in high speed semiconductor integrated circuit technology have resulted in semiconductor devices which are smaller and run faster than ever before. Such semiconductor devices also generate more heat than ever before. In order to ensure good performance and reliability of the semiconductor devices, their operational temperatures must be kept within a suitable range. Typically, a heat sink is attached to a surface of a semiconductor device, such as a central processing unit (CPU), so that heat is transferred from the semiconductor device to ambient air via the heat sink. When attaching the heat sink to the semiconductor device, respective surfaces of the device and heat sink are brought into intimate contact with each other. However, as much as 99% of the respective surfaces are separated from each other by a layer of interstitial air, no matter how precisely the heat sink and the semiconductor device are manufactured. Therefore, a thermal interface material is used to eliminate air gaps between the heat source and heat sink to improve heat flow.

Conventional thermal interface materials are thermally conductive compounds prepared by dispersing a plurality of thermally conductive fillers in a polymer matrix. The thermally conductive fillers can be graphite, boron nitride, silicon oxide, alumina, and so on. A typical thermal conductivity of the conventional thermal interface materials is only about 1 W/mK, since the polymer matrix has poor thermal conductivity. With the decreasing size and increasing speed of semiconductor devices, such as a CPU, heat dissipating requirements are increasing. To aid in solving the heat dissipation problem, an improved thermal interface material with a higher thermal conductivity is desired. One way to achieve this is to change the thermally conductive fillers in the polymer matrix. By doing this, an improvement of up to 4~8 W/mK can be achieved. However, adding thermally conductive fillers into the polymer matrix helps only up to a point. If too many thermally conductive fillers are added, the polymer matrix loses its original performance. In particular, the polymer matrix can become stiffer and less flexible, and the soakage effect may be worsened. The thermally conductive characteristics of thermal interface materials have thus been limited for the above reasons.

SUMMARY OF THE INVENTION

Accordingly, an object of the present invention is to provide a thermal interface material which is thin, and which has a high thermal conductivity.

In order to achieve the object set out above, a thermal interface material in accordance with the present invention comprises a polymer matrix and a plurality of carbon nano-capsules incorporated in the polymer matrix. The polymer matrix is generally a reaction product of a polyether polyol and an isocyanate. The carbon nano-capsules can be enclosed with high thermally conductive materials or can be filled with metal nano-grains having high thermal conductivity.

These and other features, aspects and advantages of the present invention will become more apparent from the following detailed description and claims, and from the accompanying drawings, in which:

DETAILED DESCRIPTION OF THE PRESENT INVENTION

Figure 1:
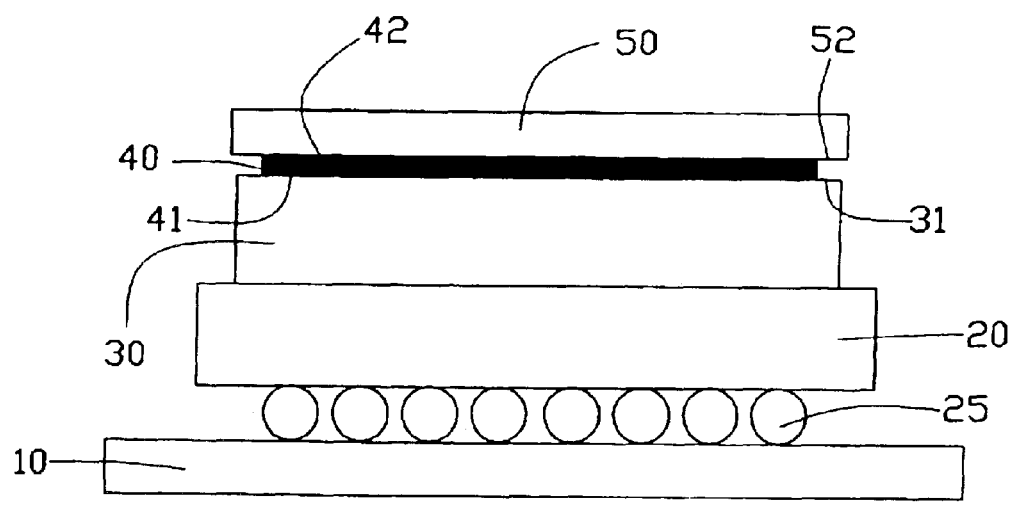
FIG. 1 is a schematic side elevation view of an electronic assembly using the thermal interface material in accordance with the preferred embodiment of the present invention.

The following description of illustrative examples and embodiments of the present invention is in connection with an electronic assembly, in which a semiconductor chip (that is a heat source) is positioned on a printed circuit board. However, the present invention is not limited to such kinds of electronic assemblies, nor indeed the electronic assembly shown in FIG. 1. The thermal interface material of the present invention can provide a maximum contact area with a heat source and a heat sink, even if the heat source and/or the heat sink has rough or uneven contact surfaces. The thermal interface material is still efficacious in transferring heat from the heat source to the heat sink.

The following illustrative examples and embodiments in their various aspects demonstrate that the present invention provides a thermal interface material which can quickly transfer heat away from a high concentration heat source to another suitable location, such as a heat dissipation device.

The thermal interface material of the present invention utilizes a plurality of carbon nanocapsules incorporated in a polymer matrix. The present invention employs carbon nanocapsules, which are polyhedral carbon clusters, and which are formed by a carbon sphere encircling another sphere. The carbon nanocapsules may be hollow or filled with metal, and may be spherical, ellipsoid, or capsule-shaped. A diameter of each carbon nanocapsule is in the range from 5~50 nm, with an average diameter of 30 nm. Therefore the thermal interface material employing carbon nanocapsules can be made thinner than those which employ metal grains therein.

The thermal interface material can be obtained by directly adding the carbon nanocapsules into a prepolymer which is generally a reaction product of a polyether polyol and an isocyanate. The prepolymer and the carbon nanocapsules are then mixed until the carbon nanocapsules are fully dispersed. The prepolymer is then solidified into a polymer matrix, and the carbon nanocapsules are held in a steady state therein.

As mentioned above, in the present invention, the prepolymer is generally a reaction product of a polyether polyol and an isocyanate. Preferably, a molecular weight of the polyether polyol is in the range from 500 to 5000, and a functionality of the polyether polyol is in the range from 3 to 9. Preferably, a molecular weight of the isocyanate is in the range from 200 to 800, and a functionality of the isocyanate is in the range from 2 to 6. A molecular chain unit of the prepolymer can be acyclic or aromatic. A desired ductility and strength of the prepolymer can be obtained by modulating the molecular weight and functionality of the polyether polyol and of the isocyanate. In the present invention, the polymer matrix is not limited to that described above, and may be varied by substitution of other materials. Such other materials are characterized by elasticity and compressibility, high thermal conductivity, and macromolecular chains of the polymer matrix which can connect with the carbon nanocapsules.

A preferred embodiment of the present invention provides a thermal interface material wherein the carbon nanocapsules are 60% by weight, the configuration of the carbon nanocapsules is generally spherical, and the carbon nanocapsules have an average diameter in the range from 30 nm to 40 nm. The thermal conductivity of the thermal interface material is about twice that of copper; namely, up to 770~780 W/mK. Preferably, the carbon nanocapsules are uniformly distributed in the polymer matrix, and they contact each other to form a number of heat passages. With such configuration, the thermal conductivity of the thermal interface material is enhanced.

In an alternative embodiment of the present invention, the carbon nanocapsules are covered with highly thermoconductive metal and are than distributed in the polymer matrix. Such carbon nanocapsules can be obtained by reacting carbon nanocapsules with a metal oxide, and producing metalliferous carbon nanocapsules and carbon dioxide gas. The metalliferous carbon nanocapsules are larger than untreated carbon nanocapsules, the contact area of the metalliferous carbon nanocapsules is greater than that of untreated carbon nanocapsules, and accordingly the thermal conductivity of the metalliferous carbon nanocapsules is higher than that of untreated carbon nanocapsules. The highly thermoconductive metal may be, but is not limited to, indium and/or copper.

Furthermore, metallic nano-grains having high thermal conductivity can be received in the carbon nanocapsules, to improve the heat conductivity of the carbon nanocapsuics. The metallic nano-grains can be selected from copper, silver and/or phosphor bronze. Phosphor bronze preferably includes 96.5% copper, 3.5~4.5% tin, 0.03~0.35% phosphorus, less than 0.5% lead, less than 0.1% iron, and less than 0.5% zinc.

FIG. 1 illustrates an electronic assembly which is a typical application of the thermal interface material of the present invention. The electronic assembly comprises a heat source 30, a heat sink 50, and a thermal interface material 40. The thermal interface material 40 is sandwiched between the heat source 30 and the heat sink 50. The heat source 30 is fastened onto a mother board 10 via solder balls 25 and a connector 20. A first surface 41 of the thermal interface material 40 contacts a top surface 31 of the heat source 30, and a second surface 42 of the thermal interface material 40 contacts a bottom surface 52 of the heat sink 50. The thermal interface material 40 is a pliable material, as described in more detail below. The thermal interface material 40 provides improved thermal contact between the heat source 30 and heat sink 50, even in the case when either or both of the top surface 31 of heat source 30 and the bottom surface 52 of heat sink 50 are Uneven. Moreover, because the thermal interface material 40 is pliable, it can act as a mechanical isolator to protect fragile components during structural loading and in environments where shock and vibration may be sustained.

The carbon nanocapsules distributed in the polymer matrix material are rigid, but the polymer matrix material itself is a pliable material. When the thermal interface material 40 is compressed during attachment of the heat sink 50 to the heat source 30, points of contact between adjacent carbon nanocapsuics in the polymer matrix material are reinforced. Furthermore, some of the carbon nanocapsules can directly contact the top surface 31 of the heat source 30 and the botton, surface 52 of the heat sink 50.

It should be understood that the present invention is not limited to the specific examples and embodiments described above. Rather, the present invention is intended to cover various modifications and equivalent arrangements included within the spirit and scope of the claims.

What is claimed is:

1. A thermal interface material comprising:

a polymer matrix having a thermally conductive first face and an opposite thermally conductive second face; and a plurality of carbon nanocapsules incorporated in the polymer matrix, the carbon nanocapsules being filled with metal nano-grains.

2. The thermal interface material as recited in claim 1, wherein the polymer is generally a reaction product of a polyether polyol and an isocyanate.

3. The thermal interface material as recited in claim 2, wherein a molecular weight of the polyether polyol is in the range from 500 to 5000.

4. The thermal interface material as recited in claim 2, wherein a functionality of the polyether polyol is in the range from 3 to 9.

5. The thermal interface material as recited in claim 2, wherein a molecular weight of the isocyanate is in the range from 200 to 800.

6. The thermal interface material as recited in claim 2, wherein a functionality of the isocyanate is in the range from 2 to 6.

7. The thermal interface material as recited in claim 1, wherein the carbon nanocapsules are enclosed with thermally conductive material.

8. The thermal interface material as recited in claim 7, wherein the thermally conductive material comprises indium and/or copper.

9. The thermal interface material as recited in claim 1, wherein the metal nano-grains comprise silver, copper and/or phosphor bronze.

10. The thermal interface material as recited in claim 7, wherein a diameter of each carbon nanocapsule is in the range from 5 to 50 nm.

\* \* \* \* \*